(12) United States Patent
Hirota et al.

(10) Patent No.: US 8,125,791 B2
(45) Date of Patent: Feb. 28, 2012

(54) PORTABLE ELECTRONIC DEVICE

(75) Inventors: Hiroyuki Hirota, Yokohama (JP);
Takashi Hasegawa, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 952 days.

(21) Appl. No.: 12/124,933

(22) Filed: May 21, 2008

(65) Prior Publication Data
US 2008/0291647 A1 Nov. 27, 2008

(30) Foreign Application Priority Data

May 23, 2007 (JP) ................. 2007-136839
Oct. 26, 2007 (JP) ................. 2007-279180

(51) Int. Cl.
*H05K 7/02* (2006.01)
(52) U.S. Cl. ...... 361/769; 361/752; 361/730; 455/575.1; 174/520
(58) Field of Classification Search ............... 361/776, 361/807, 769, 752; 455/550.1, 575.1, 575.3, 455/575.4; 174/520
See application file for complete search history.

(56) References Cited

U.S. PATENT DOCUMENTS

| 6,011,699 A | * | 1/2000 | Murray et al. | 361/814 |
| 7,408,786 B2 | * | 8/2008 | Lowles et al. | 361/760 |
| 2007/0253178 A1 | * | 11/2007 | Uchiumi et al. | 361/807 |

FOREIGN PATENT DOCUMENTS

| JP | 2000-232505 | 8/2000 |
| JP | 2004-159173 | 6/2004 |
| JP | 2006-067524 | 3/2006 |

* cited by examiner

*Primary Examiner* — Dameon Levi
(74) *Attorney, Agent, or Firm* — Procopio, Cory, Hargreaves & Savitch LLP (57) ABSTRACT

A portable electronic device includes a case, a circuit board in the case, an electronic component in the case. The electronic component includes a connection terminal and a portion facing a side surface of the circuit board. The portable electronic device also includes a terminal member for connecting the circuit board and the connection terminal of the electronic component.

8 Claims, 11 Drawing Sheets

PORTABLE ELECTRONIC DEVICE

CROSS REFERENCES TO RELATED APPLICATIONS

This application claims foreign priority based on Japanese Patent Application No. 2007-136839, filed May 23, 2007 and Japanese Patent Application No. 2007-279180, filed Oct. 26, 2007, the contents of which are incorporated herein by reference in their entirety.

BACKGROUND OF THE INVENTION

1. Field of the Invention

The present invention relates to portable electronic devices such as a mobile phone, a digital camera, a PDA, a notebook personal computer, and a game machine.

2. Description of the Related Art

Japanese Unexamined Patent Application Publication No. 2000-232505 discloses a portable electronic device including a case having two sub-cases, and a circuit board and a speaker provided between the sub-cases. Between the circuit board and the speaker, a terminal member having a coil spring is provided to electrically connect the circuit board and the speaker. Since the circuit board, the terminal member and the speaker are thus stacked between the two sub-cases, it is necessary to form a space that allows stacking in the thickness direction between the two sub-cases.

SUMMARY OF THE INVENTION

According to one aspect of the invention, a portable electronic device includes a case; a circuit board in the case; an electronic component in the case. The electronic component includes a connection terminal and a portion facing a side surface of the circuit board. The portable electronic device includes a terminal member for connecting the circuit board and the connection terminal of the electronic component.

DESCRIPTION OF THE PREFERRED EMBODIMENTS

A mobile phone 1 serving as a portable electronic device according to a first embodiment of the present invention will be described.

The mobile phone 1 is of a so-called folding type, and includes a first case 3 and a second case 5 serving as a case, and a connecting portion 7 that pivotally connects the first case 3 and the second case 5. The first case 3 and the second case 5 can pivot about a pivot shaft RA between an open state shown in FIGS. 1A to 1C and a closed state (not shown).

The first case 3 and the second case 5 are shaped so that outlines thereof substantially coincide with each other when placed one on another in a closed state. For example, the first case 3 and the second case 5 are each shaped like a thin rectangular parallelepiped.

Figure 1A:
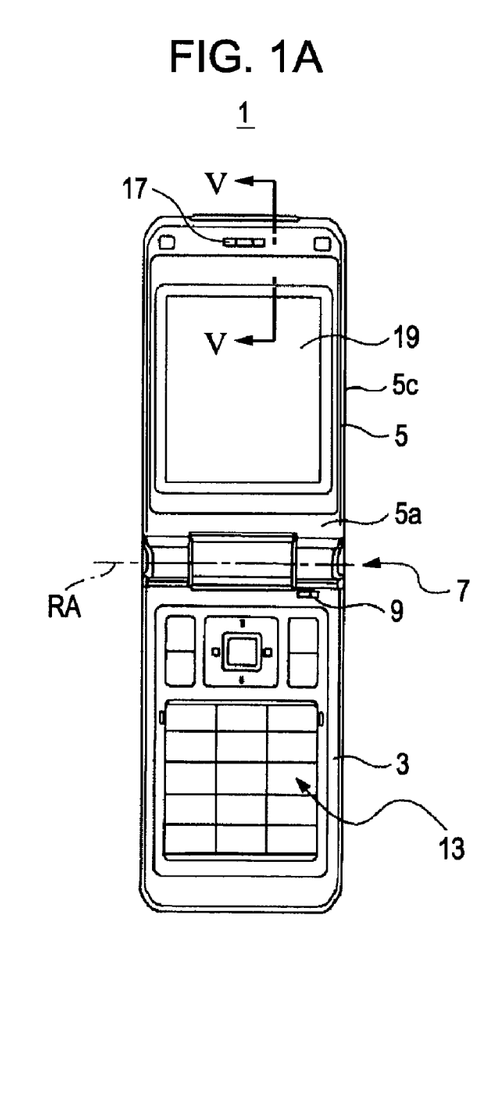
FIGS. 1A to 1C are external views of a mobile phone according to a first embodiment of the present invention.

A direction orthogonal to the longitudinal direction of the first and the second cases 3 and 5 and parallel to the pivot shaft RA shown in FIG. 1A is referred to as a width direction. A direction in which the first case 3 and the second case 5 are arranged in the open state shown in FIG. 1A is referred to as a length direction.

Figure 1B:
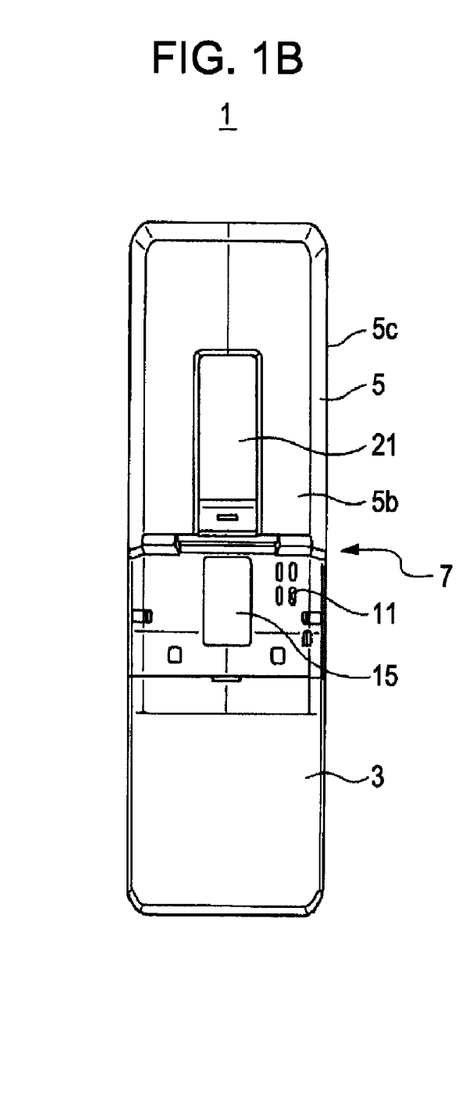
Figure 1C:
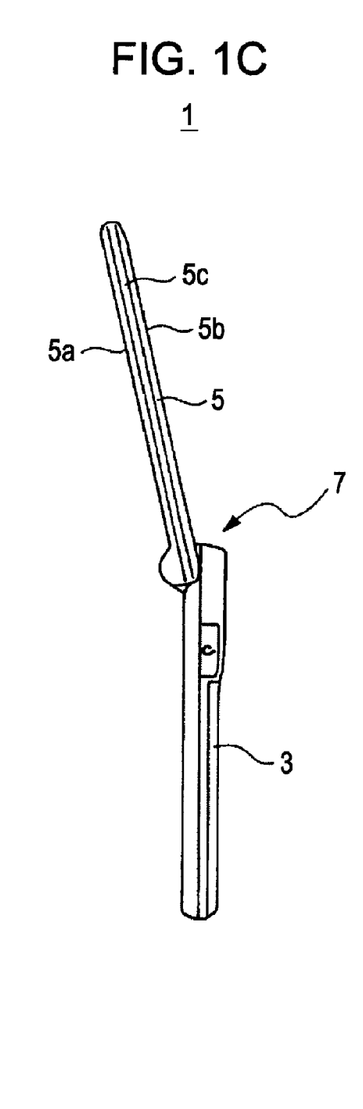
Figure 6:
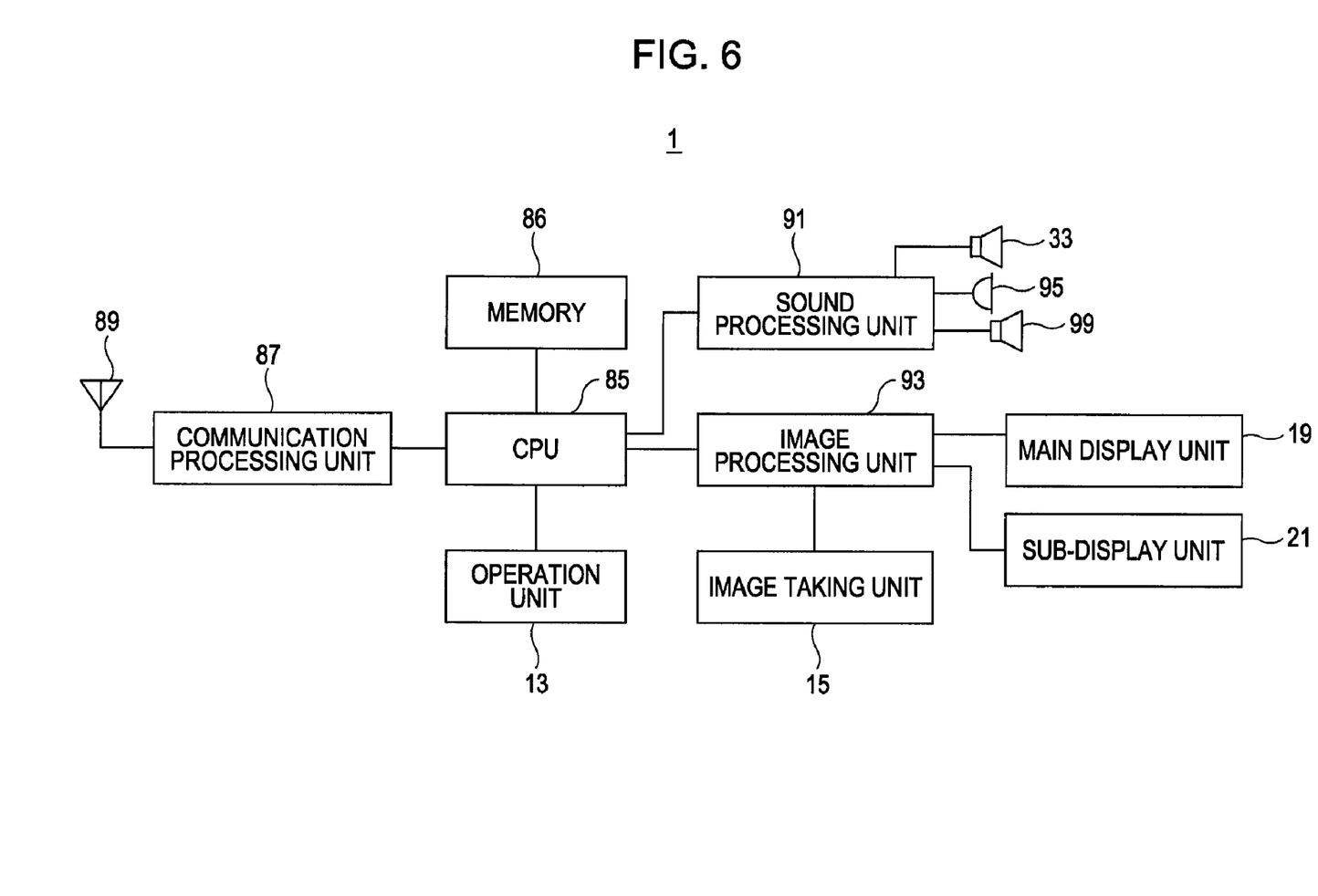
FIG. 6 is a block diagram showing the configuration of a signal processing system in the mobile phone shown in FIGS. 1A to 1C.

For example, as shown in FIGS. 1A, 1B, and 6, the first case 3 includes a sound pickup hole 9 for a microphone, and first sound output holes 11 for a first speaker 99 which outputs a sound such as a ringtone. The first case 3 also includes an operation unit 13 that accepts operations of the user, and an image taking unit 15 for taking images.

As shown in FIGS. 1A, 1B, 1C, 2 and 5 the second case 5 includes a first principal surface 5a that faces the first case 3 in a closed state, and a second principal surface 5b provided at the back of the first principal surface 5a. For example, the second case 5 includes a second sound output release hole 17 for a second speaker 33 which outputs a sound from the incoming caller. The second speaker 33 corresponds to an electronic component. In the second case 5, a main display unit 19 for displaying images including figures, characters, etc, and a sub-display unit 21 are arranged. The main display unit 19 is provided on the first principal surface 5a, and the sub-display unit 21 is provided on the second principal surface 5b. The main display unit 19 includes a main display 27 and a panel 25. The sub-display unit 21 includes a sub-display 31 and a light-transmissive member 61.

Figure 2:
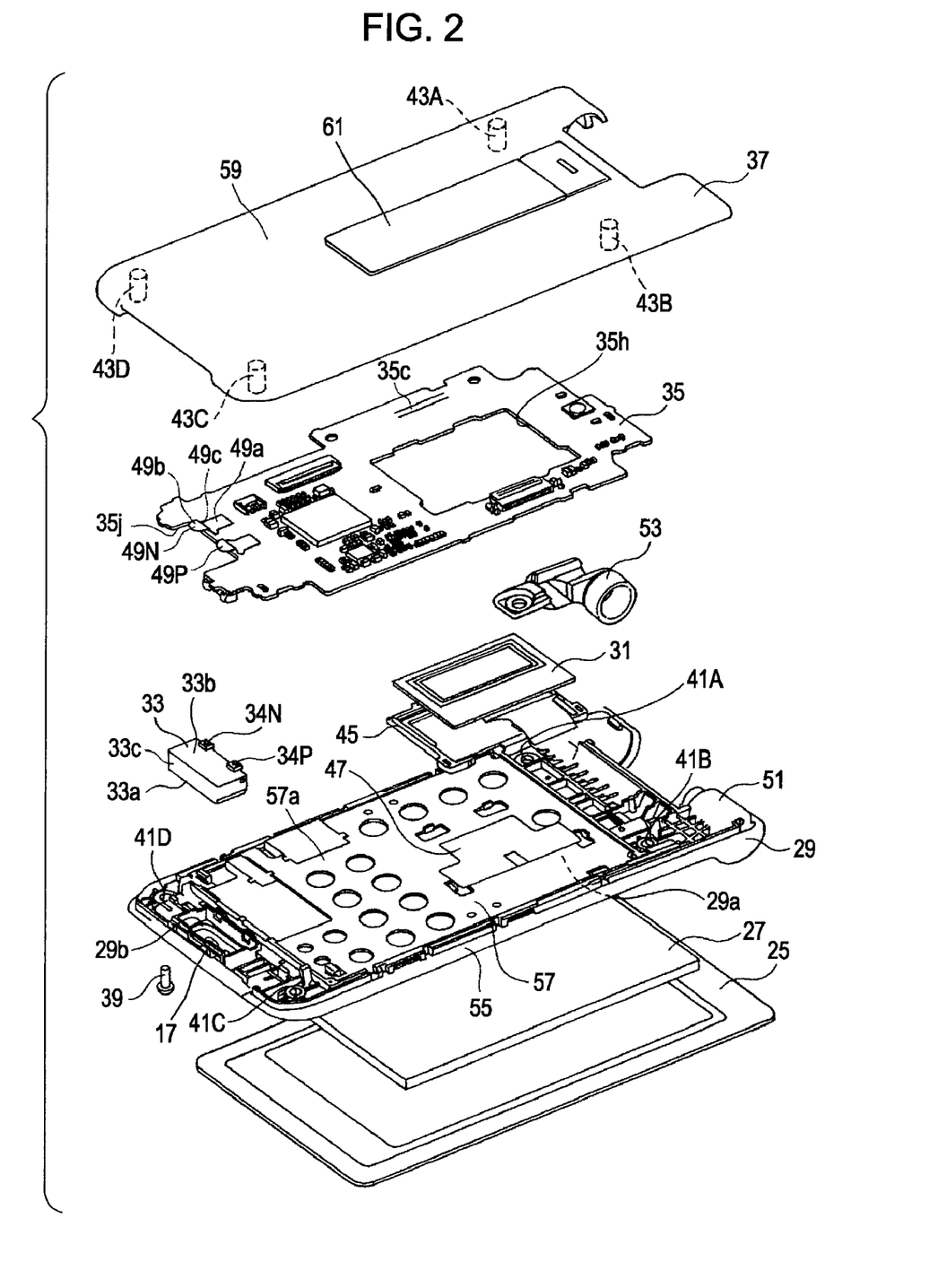
FIG. 2 is an exploded perspective view of a second case in the mobile phone shown in FIGS. 1A to 1C.
Figure 5:
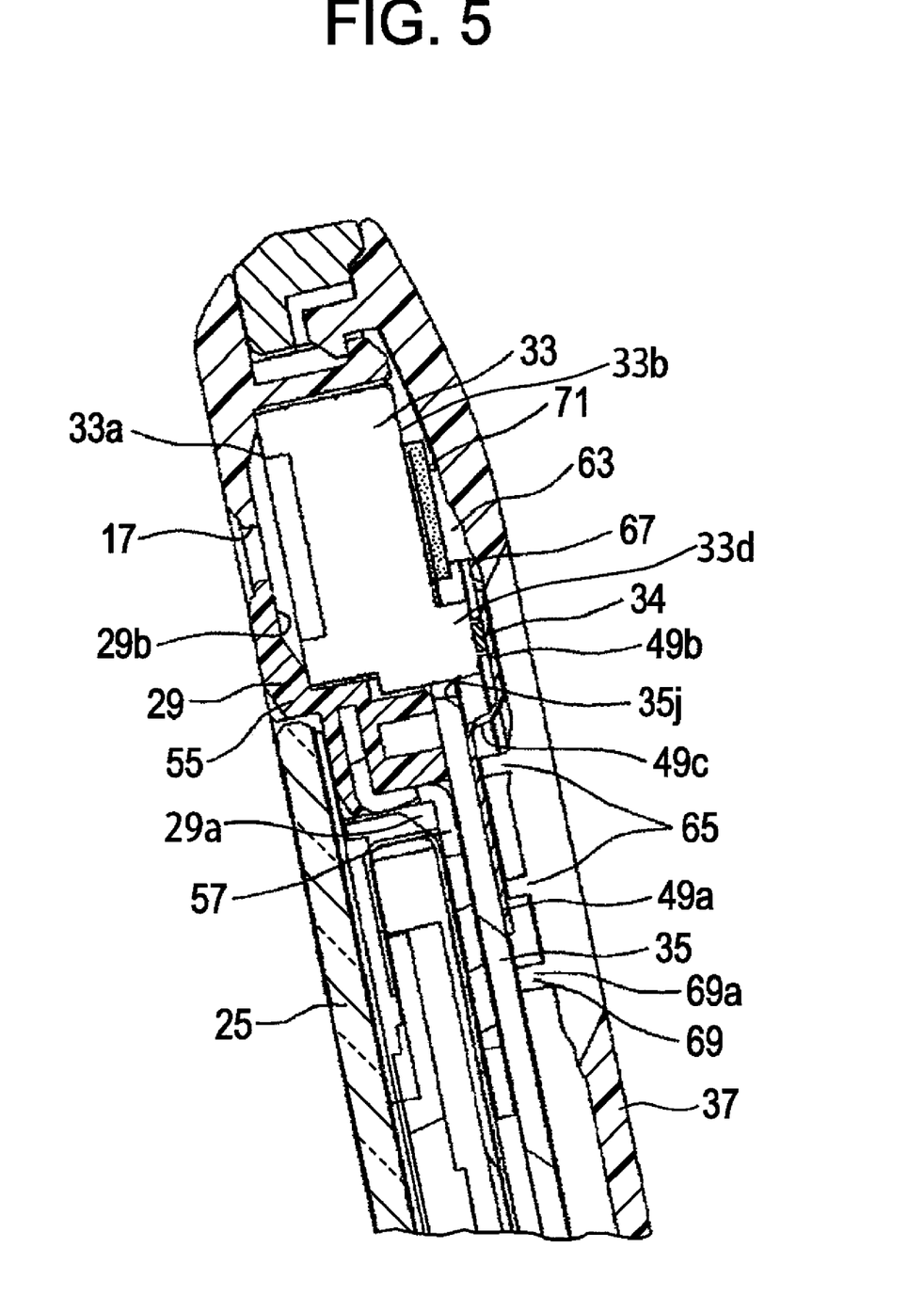
FIG. 5 is a cross-sectional view on arrow V-V in FIG. 1A.

In the second case 5, the panel 25, the main display 27, the sub-display 31, the second speaker 33, and a circuit board 35 are stacked in that order from a side of the first principal surface 5a.

The second case 5 also includes a front case 29 serving as a first sub-case, and a rear case 37 serving as a second sub-case. The front case 29 has the panel 25 and the first principal surface 5a. The rear case 37 has the second principal surface 5b.

The front case 29 and the rear case 37 are fixed to each other by fixing units. The fixing units may include holes 41A to 41D provided at the front case 29, screw bosses 43A to 43D provided on an inner surface of the rear case 37, and screws 39 inserted into holes 41A to 41D through holes 41A to 41B. The screws 39 are tightened to fix the front case 29 and the rear case 37.

The second speaker 33 and the circuit board 35 are directly or indirectly clamped between the front case 29 and the rear case 37.

The front case 29 includes a resin portion 55 provided on the outer periphery thereof and a sheet metal portion 57 buried in the resin portion 55 by insert molding. The sheet metal portion 57 may contribute to reducing the thickness of the front case 29 with maintaining strength of the front case 29.

The sheet metal portion 57 includes a concave portion 29a in which the main display 27 is fitted. The rear case 37 includes a body member 59 and a light-transmissive member 61 which faces the sub-display 31 in the second case 5. The light-transmissive member 61 functions as a window of the sub-display 31.

The body member 59 may have a size and shape substantially equal to those of the front case 29, and may include glass or a light-shielding resin. The body member 59 has an aperture at a position corresponding to the sub-display 31, and the light-transmissive member 61 covers the aperture. The above-described screw bosses 43A to 43D are provided integrally with the body member 59.

The light-transmissive member 61 is fixed to the body member 59 by a first fixing member such as a double-sided adhesive tape and/or an adhesive.

The panel 25 may include a light-transmissive resin or glass, and covers a display surface of the main display 27. The panel 25 may be fixed to the front case 29 by a second fixing member. The second fixing member may include a double-sided adhesive tape and/or an adhesive.

As the above-described, the main display unit 19 provided on the first principal surface 5a of the second case 5 includes the main display 27 and the panel 25. The main display 27 may include a liquid crystal display and/or an organic EL display. The main display 27 is fitted in the concave portion 29a of the sheet metal portion 57 of the front case 29 so as to be placed between the front case 29 and the panel 25.

The sub-display unit 21 provided on the second principal surface 5b of the second case 5 includes the sub-display 31. The sub-display 31 may include a liquid crystal display and/or an organic EL display. The sub-display 31 is held in a holder 45 mounted on a surface 57a of the sheet metal portion 57 by a double-sided adhesive tape 47, and is thereby held in the second case 5. The holder 45 may include an elastic material and may be shaped like a frame.

The circuit board 35 clamped between the front case 29 and the rear case 37 is provided in the second case 5.

The circuit board 35 may include a printed circuit board and a control circuit on the printed circuit board. The control circuit controls the operation of the main display 27 and the sub-display 31. The circuit board 35 has an aperture 35h in which the sub-display 31 and the holder 45 are fitted. The fitted sub-display 31 and the holder 45 in the aperture 35h are placed inside the second case 5 without being stacked on the circuit board 35 in the thickness direction of the second case 5.

The panel 25, the main display 27, the front case 29, the sub-display 31 and the rear case 37 are stacked in that order from the first principal surface 5a to the second principal surface 5b.

The second speaker 33, which is an exemplary electronic component, is stored in an end portion of the second case 5. The second speaker 33 may include a speaker case 33c having a sound output surface 33a, a terminal surface 33b which is provided at the back of the sound output surface 33a. The terminal surface 33b has projecting portions 33d. The second speaker 33 also may include connection terminal 34 (34N and 34P) arranged on the projecting portions 33d of the terminal surface 33b in the width direction of the second case 5. The second speaker 33 may be a dynamic speaker. The second speaker 33 also may include a diaphragm (not shown) in the speaker case 33c. The second speaker 33 converts changes in the potential difference between the connection terminals 34 into vibration of the diaphragm, that is, converts an input audio signal into sound and outputs the sound from the sound release surface 33a.

While the shape of the speaker case 33c is not particularly limited, the speaker case 33c is substantially shaped like a rectangular parallelepiped in this embodiment. Preferably, the connection terminals 34 may include a rigid body, for example, a metal shaft member or flat terminal plate.

The second speaker 33 is fitted in a concave portion 29b provided in the inner surface of the front case 29, and is thereby supported by the front case 29. The sound output surface 33a of the second speaker 33 faces the front case 29. The connection terminals 34 of the second speaker face the rear case 37. A sound output hole 17 is provided at the bottom of the concave portion 29b.

The circuit board 35 has a cutout 35j at an end opposite the connecting portion 7. The second speaker 33 is also fitted in the cutout 35j of the circuit board 35. The second speaker 33 and the circuit board 35 are arranged side by side. Specifically, the second speaker 33 and the circuit board 35 are arranged in the second case 5 so that the second speaker 35 has a portion which faces a side surface of the circuit board 35. Since the circuit board 35 are not stacked on the second speaker 33, the thickness of the second case 5 can be reduced. It is not necessary that the portion of the second speaker 35 directly face the side surface of the circuit board 35. The portion of the second speaker 35 may indirectly face the side surface of the circuit board 35 through any other components. In other words, a part of the above-described components or an additional component may be arranged in between the portion of the second speaker 35 and the side surface of the circuit board 35.

As shown in FIG. 2, the circuit board 35 also includes terminal members 49 (49N and 49P) for electrically connecting the circuit board 35 to the connection terminals 34 of the second speaker 33. The terminal members 49 protrude toward the rear case 37.

As shown in FIG. 5, each of the terminal members 49 includes a mounting portion 49a mounted on the circuit board 35, a contact portion 49b in contact with the corresponding connection terminal 34 of the second speaker 33, and a step portion 49c that connects the mounting portion 49a and the contact portion 49b.

Figure 3:
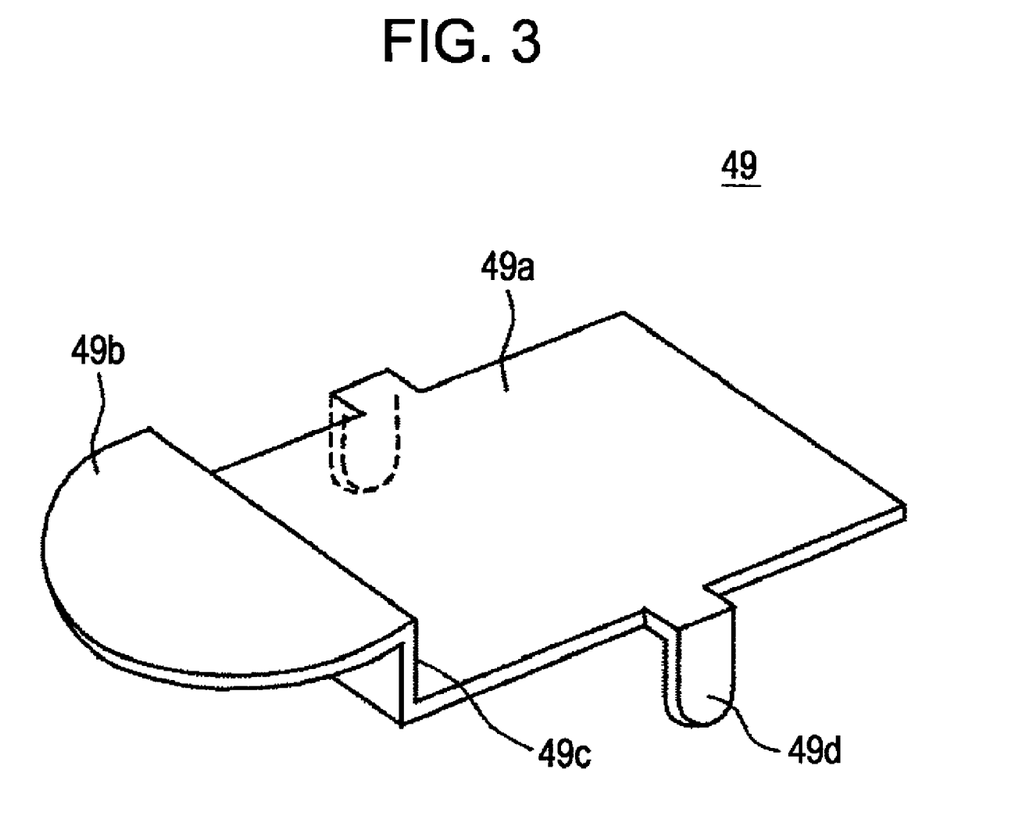
FIG. 3 is a perspective view of a terminal member provided in the second case shown in FIG. 2.

The mounting portion 49a and the contact portion 49b may be substantially shaped like a flat plate. The mounting portion 49a has an area larger than that of the contact portion 49b. The mounting portion 49a has a weight larger than that of the contact portion 49b. The mounting portion 49a is shaped like, for example, a rectangle extending in a direction in which the mounting portion 49a and the contact portion 49b are arranged. For example, the contact portion 49b is semicircular so that the width thereof decreases away from the mounting portion 49a.

The length of the mounting portion 49a in the arrangement direction of the mounting portion 49a and the contact portion 49b is larger than the length of the contact portion 49b in the arrangement direction. Moreover, the width of the contact portion 49b in the direction orthogonal to the arrangement direction is less than or equal to the width of the mounting portion 49a.

The terminal member 49 also includes engaging portions 49d connected to the mounting portion 49a, for positioning the terminal member 49 on the circuit board 35. The engaging portions 49d are fitted in engaging holes provided in the circuit board 35. Solder is put among the engaging portions 49d, the mounting portion 49a and the circuit board 35. The engaging portions 49d and the mounting portion 49a are soldered to the circuit board 35 by reflowing, so that the terminal member 49 and the circuit board 35 are connected electrically. Instead of forming the engaging portions 49d, the terminal member 49 may be joined to the circuit board 35 only at the mounting portion 49a.

As described above, since the mounting portion 49a is heavier than the contact portion 49b, the terminal member 49 is stably placed on the circuit board 35. Therefore, when the terminal member 49 is soldered to the circuit board 35, tilting of the terminal member 49 and lifting of the mounting portion 49a from the circuit board 35 can be prevented.

It is preferable that the terminal member 49 have elasticity in the protruding direction thereof, as in this embodiment.

As described above, each of the terminal members 49 includes the mounting portion 49a and the contact portion 49b. The mounting portion 49a is mounted on the circuit board 35, and the contact portion 49b extends toward the second speaker 33 in the direction parallel to the mounting surface of the circuit board 35 to contact the connection terminals 34 of the second speaker 33. Therefore, the second speaker 33 and the circuit board 35 are electrically connected through the terminal members 49.

Figure 4:
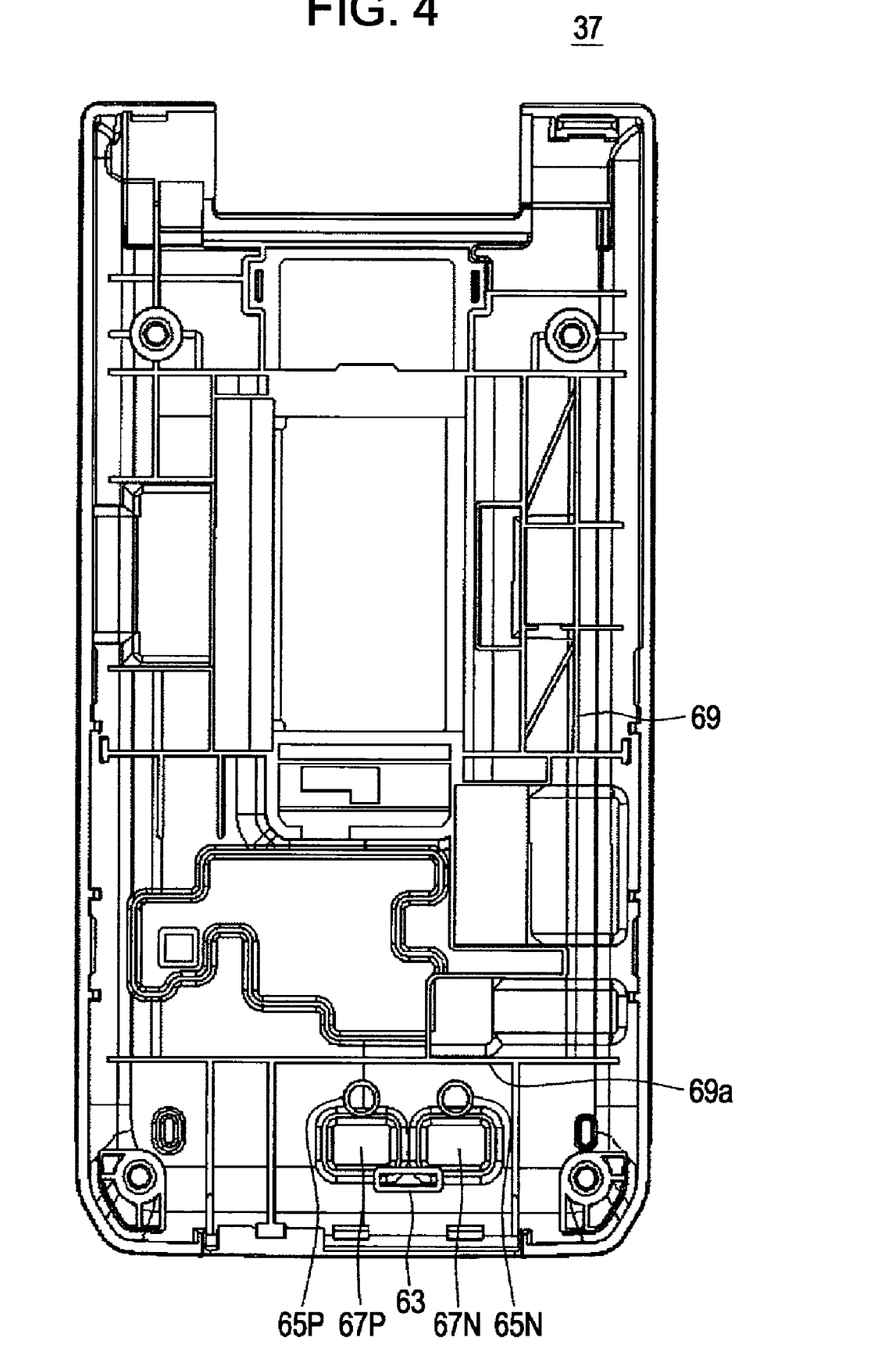
FIG. 4 is a plan view showing an inner surface of a rear case in the second case shown in FIG. 2.

As shown in FIG. 4, the rear case 37 includes a first projecting portion 63, second projecting portions 65 (65N and 65P) as a contact region and a pressing portion, concave portions 67 (67N and 67P), and a rib 69 as a pressing portion, all of which are provided on an inner surface of the rear case 37. The first projecting portion 63 presses the terminal surface 33b of the second speaker 33 toward the front case 29 via an elastic member 71 which may include sponge or rubber. The second projecting portions 65 contact and press the mounting portions 49a of the terminal members 49 against the circuit board 35. The concave portions 67 receive the contact portions 49b of the terminal members 49. The rib 69 contacts and presses the circuit board 35.

Therefore, the terminal surface 33b of the second speaker 33 is pressed by the rear case 37, and the sound release surface 33a of the second speaker 33 is pressed by the above-described front case 29. As a result, the second speaker 33 is clamped and stably held between the front case 29 and the rear case 37. Since the concave portions 67 form clearances between the second speaker 33 and the rear case 37, a back cavity of the second speaker 33 can be provided. This can ensure high sound quality. Further, the circuit board 35 is in contact with the rib 69 of the rear case 37, and is pressed toward the front case 29 by the rib 69.

As described above, the terminal members 49 have elasticity. The elastic member 71 is provided between the terminal members 49 and the rear case 37. Therefore, even when an impact is applied to the rear case 37, it is reduced by the terminal members 49 and the elastic member 71. As a result, the second speaker 33 can be protected.

The contact portions 49b of the terminal members 49 are placed in the concave portions 67, and clearances are provided between the concave portions 67 and the contact portions 49b. This allows the contact portions 49b to shift toward the rear case 37.

Since the concave portions 67 are formed by reducing the thickness of the rear case 37, it is possible to reduce the thickness of the entire case, to improve sound quality by ensuring the back cavity of the second speaker 33.

The second projecting portions 65 of the rear case 37 press the mounting portions 49a of the terminal members 49 against the circuit board 35.

Therefore, a restoring force is generated by pushing the contact portions 49b up toward the rear case 37 by the connection terminals 34, whereby a proper contact pressure is ensured and the mounting portions 49a are reliably prevented from separating because of the push by the connection terminals 34.

The configuration of a signal processing system in the mobile phone 1 will now be described with reference to FIG. 6.

The mobile phone 1 includes a CPU 85, a memory 86, a communication processing unit 87, a sound processing unit 91, and an image processing unit 93. For example, these units are formed by ICs provided on the circuit board 35.

The CPU 85 and the memory 86 perform desired processing according to signals input from the units such as the operation unit 13, and control the units such as the image processing unit 93.

The communication processing unit 87 includes a high-frequency circuit. In order to perform wireless telecommunication using radio waves, the communication processing unit 87 modulates various data processed by the CPU 85, such as audio data and image data, and transmits the modulated data via an antenna 89. Further, the communication processing unit 87 demodulates signals received via the antenna 89, and outputs the signals to the CPU 85.

The sound processing unit 91 converts audio data from the CPU 85 into electric signals, and outputs the signals to the second speaker 33 and the first speaker 99. The second speaker 33 and the first speaker 99 convert electric signals from the sound processing unit 91 into sound, and outputs the sound. On the other hand, a microphone 95 converts input sound into electric signals and outputs the electric signals to the sound processing unit 91. The sound processing unit 91 converts the electric signals from the microphone 95 into audio data and outputs the audio data to the CPU 85.

The image processing unit 93 converts image data from the CPU 85 into image signals and outputs the image signals to the main display unit 19 and the sub-display unit 21. The image processing unit 93 also converts taken-image signals (image data) output from the image taking unit 15 into predetermined-format image data, and outputs the image data to the CPU 85.

The portable electronic device is not limited to a mobile phone, and may be, for example, a PDA, a notebook personal computer, a digital camera, or a game machine. The electronic component is not limited to a speaker, and may be, for example, a microphone. Further, the electronic component is not limited to an electro-acoustic conversion component such as a speaker or a microphone, and may be, for example, an antenna or a battery. The terminal member 49 is not limited to a member shaped like a flat spring.

Figure 7A:
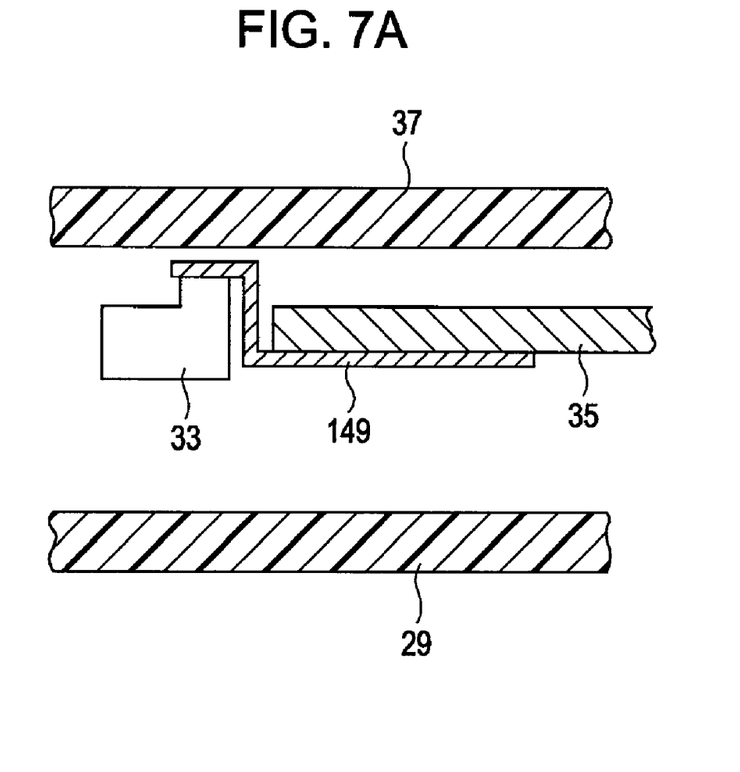
FIGS. 7A and 7B show modifications of the first embodiment.
Figure 7B:
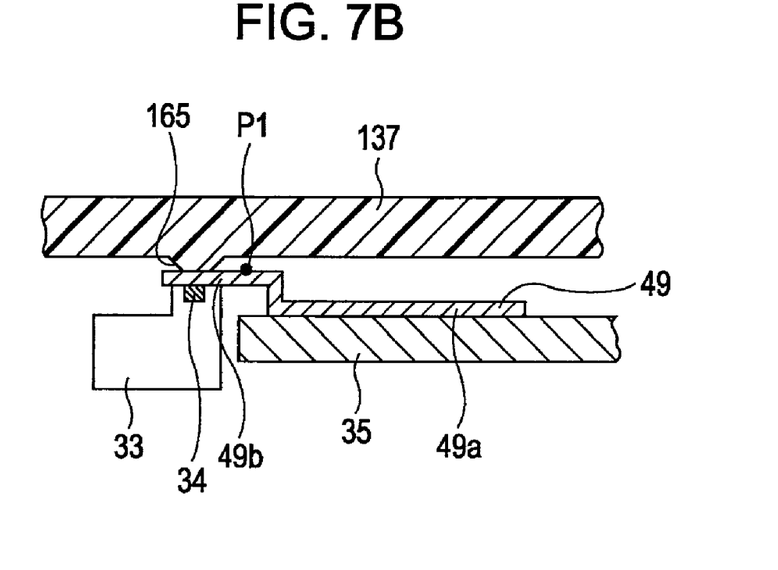

The terminal members 49 can have any structure that electrically connects the circuit board 35 to an electronic component (the second speaker 33 in this embodiment) including a portion which faces a side surface of the circuit board 35 in the direction parallel to the mounting surface of the circuit board 35. For example, as shown in FIG. 7A, a terminal member 149 may pass through a clearance between the second speaker 33 and the circuit board 35. In this case, a mounting portion 49a and a contact portion 49b of the terminal member 149 directly or indirectly face the front case 29 and the rear case 37, respectively. Alternatively, as shown in FIG. 7B, a contact portion 49b of a terminal member 49 may be pressed against a connection terminal 34 by a projecting portion 165 of a rear case 137. The projection portion 165 serves as a contact region of the rear case 137. In this case, when the rear case 137 is joined to a front case 29, the projecting portion 165 of the rear case 137 presses the contact portion 49b, thus ensuring a contact pressure between the contact portion 49b and the connection terminal 34.

In FIG. 7B, the projecting portion 165 presses the contact portion 49b at the connection terminal 34. Alternatively, it may press the contact portion 49b at a position P1 between the connection terminal 34 and a mounting portion 49a. In this case, a contact pressure between the contact portion 49b and the connection terminal 34 is ensured by elastic force of the contact portion 49b, and this can reduce separating the contact portion 49b from the connection terminal 34.

A description will be given below of a mobile phone as an exemplary portable electronic device according to a second embodiment of the present invention.

Figure 8A:
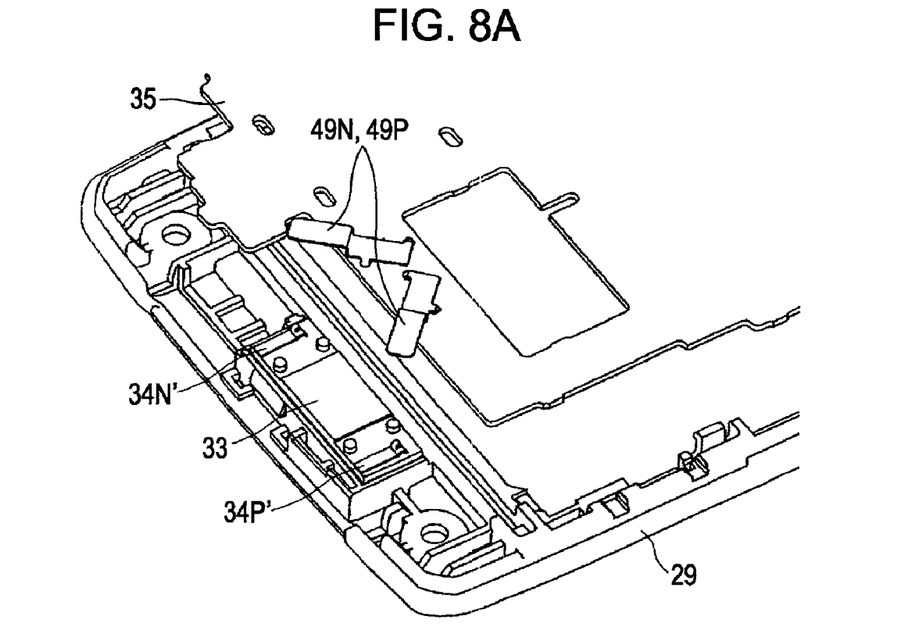
FIGS. 8A and 8B show a connection relationship between a second speaker and a circuit board according to a second embodiment.
Figure 8B:
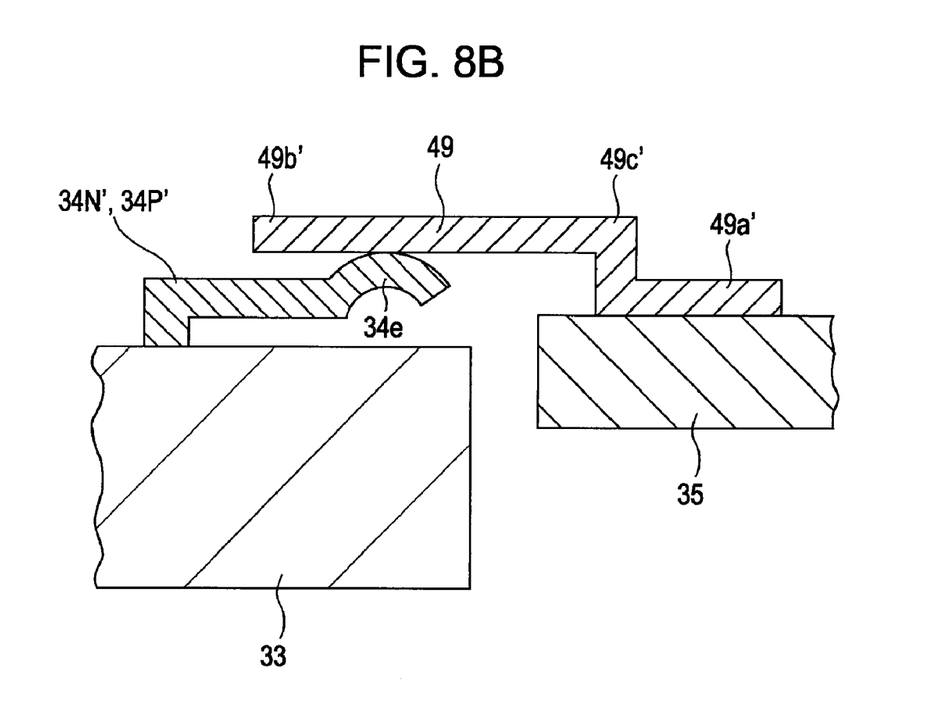

FIGS. 8A and 8B show a connection relationship between a second speaker 33 and a circuit board 35 provided in a second case 5.

In order to minimize the thickness of a case of a mobile phone 1, the second speaker 33 is placed so as not to overlap with the circuit board 35 in the thickness direction, as shown in FIG. 8A. FIG. 8A is a perspective view showing an exemplary arrangement of the circuit board 35 and the second speaker 33.

As shown in FIG. 8A, as structures for electrically connecting the circuit board 35 and the second speaker 33 and supplying power to the second speaker 33 via the circuit board 35, terminal members 49 (49N and 49P) are provided on the circuit board 35, and a connection terminal 34 includes flat springs 34N' and 34P' on the second speaker 33. Leading ends of the terminal members 49 are in contact with the flat springs 34N' and 34P' so that power is supplied to the second speaker 33 via the circuit board 35. In FIG. 8A, the terminal members 49 are turned from their original positions in order to more easily view the overall configuration. Originally, the terminal members 49 reach directly onto the flat springs 34N' and 34P', and are in direct contact with the flat springs 34N' and 34P' for power supply, as shown in FIG. 8B. FIG. 8B is a cross-sectional view of the mobile phone 1, taken along a line passing through the terminal member 49 and the corresponding flat spring 34N' or 34P'.

As shown in FIG. 8B, each of the terminal members 49 includes a mounting portion 49a' bonded and fixed to the circuit board 35, a contact portion 49b' having a free end and a portion which contacts the flat springs 34N' or 34P'. Each of the terminal members 49 also includes a step portion 49c' provided between the mounting portion 49a' and the contact portion 49b'. The terminal member 49 is between the circuit board 35 and the rear case 37, and is provided at an end of the circuit board 35 close to the second speaker 33.

As shown in FIG. 8B, each of the flat spring 34N' and 34P' includes a spring member that is fixed at one end to the second speaker 33, but is not fixed at the other end to the second speaker 33 and is movable in the up-down direction. The other end of the flat spring 34N' or 34P' that is not fixed extends from the fixed end toward the circuit board 35. The other end has an arc-shaped edge 34e that ensures a good contact with the terminal member 49.

The terminal members 49 and the flat springs 34N' and 34P' are in contact with each other at the contact portions 49b' of the terminal members 49 and the arc-shaped edges 34e of the flat springs 34N' and 34P'. Power is supplied from a battery to the second speaker 33 through the circuit board 35, the terminal members 49 and the flat springs 34N' and 34P'. The terminal members 49 and the flat springs 34N' and 34P' include a conductive material such as metal.

In order to make it easy to mount the terminal member 49, the terminal members 49 in the second embodiment have the center of gravity at the mounting portions 49a', which means that the center of gravity of terminal member 49 is closer to the mounting portion 49a' than to the contact portion 49b' of the terminal member 49.

Figure 9:
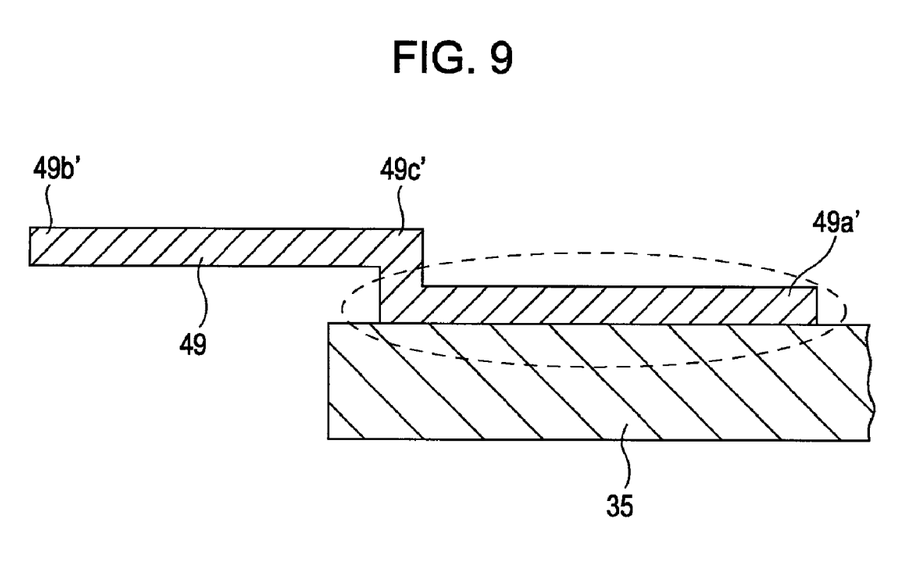
FIG. 9 is an explanatory view showing a first exemplary terminal member in the second embodiment.

FIG. 9 explains a first example of an terminal member 49 in the second embodiment.

As shown in FIG. 9, a mounting portion 49a' of the terminal member 49 has an area larger than the area of a contact portion 49b' so as to be heavier than the contact portion 49b'.

In this case, the center of gravity of the entire terminal member 49 deviates to the mounting portion 49a'. Therefore, when the terminal member 49 is mounted on the circuit board 35, the contact portion 49b' can be reliably supported by the mounting portion 49a'.

Figure 10:
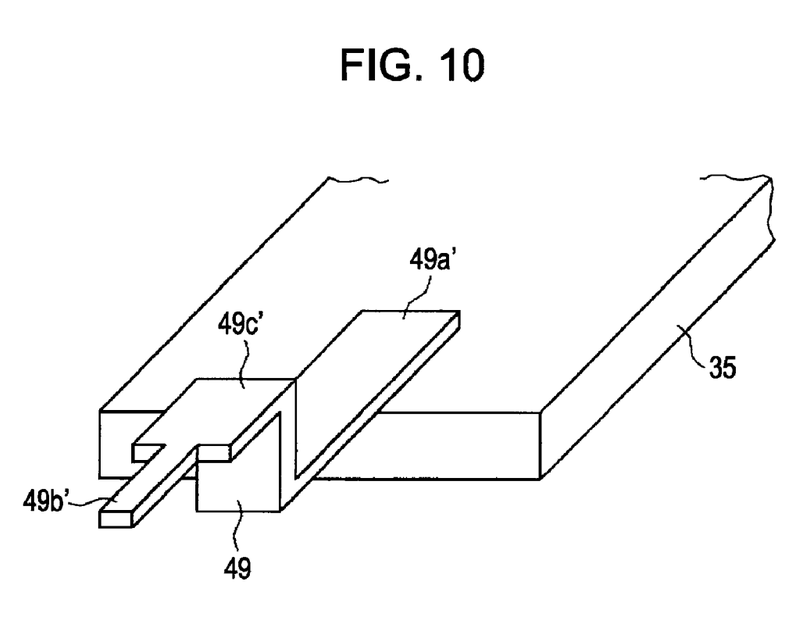
FIG. 10 is an explanatory view showing a second exemplary terminal member in the second embodiment.

FIG. 10 explains a second example of an terminal member 49 in the second embodiment. As shown in FIG. 10, a contact portion 49b' of the terminal member 49 may be thin at a leading end thereof. Since the terminal member 49 has the thin leading end of the contact portion 49b' so as to reduce the weight of the contact portion 49b', it can reduce the possibility that a mounting portion 49a' is lifted from the circuit board 35 by the weight of the contact portion 49b' during mounting on the circuit board 35.

A mobile phone 1 according to a third embodiment of the present invention will now be described in reference with FIGS. 11A, 11B and 12.

Figure 11A:
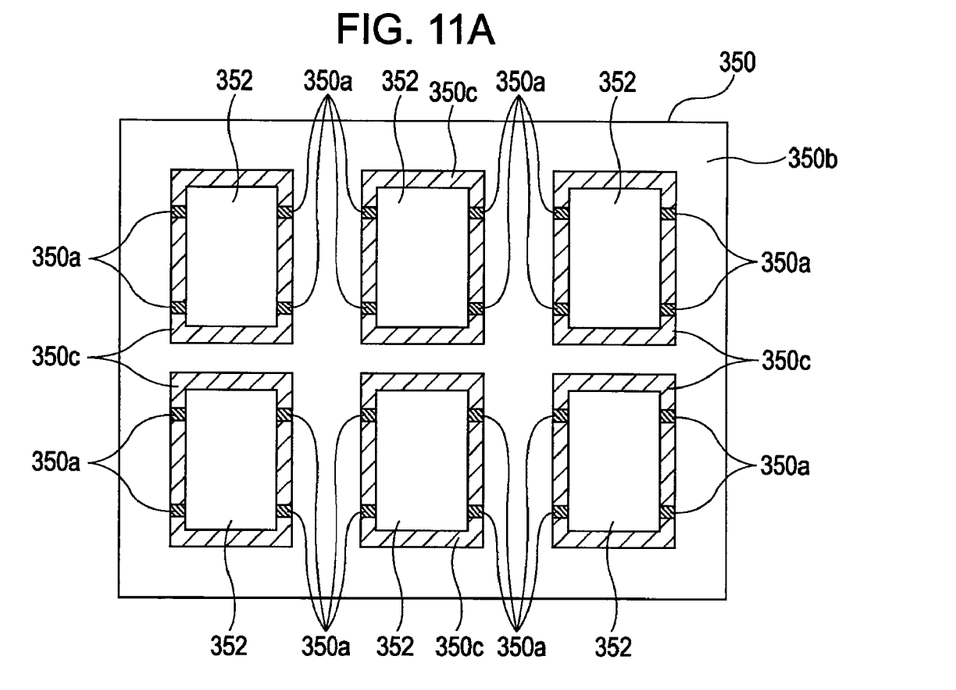
FIGS. 11A to 11B are explanatory views showing a method for forming circuit boards according to a third embodiment of the present invention.
Figure 11B:
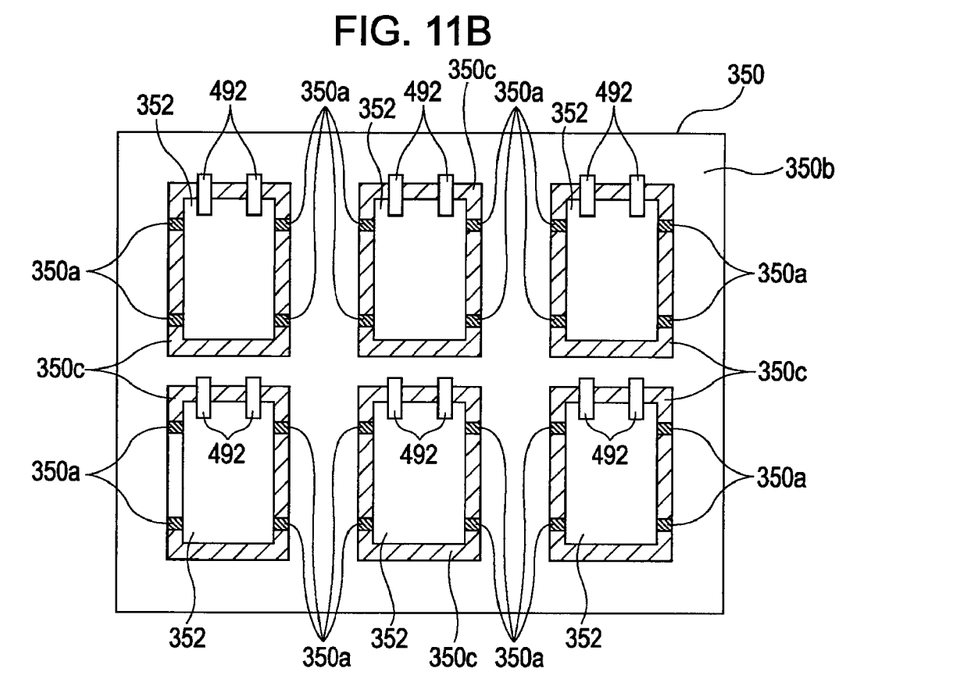

In the third embodiment, as shown in FIGS. 11A and 11B, a plurality of circuit boards 352 are to be cut out from a large substrate 350. The large substrate 350 is large enough to form a plurality of circuit boards 352.

More specifically, before the larger substrate 350 are cut out, the circuit boards 352 are connected to the large substrate 350 by connecting portions 350a. Subsequently, integrated circuits necessary for the operation of the mobile phone 1 and terminal members 492 are simultaneously mounted on the circuit boards 352, for example, by reflowing. After that, the circuit boards 352 are obtained by cutting the connecting portions 350a.

In FIGS. 11A and 11B, an unnecessary portion 350b is left in the large substrate 350 after the circuit boards 352 are cut out. Clearances between the circuit boards 352 and the unnecessary portion 350b of the large substrate 350 serve as cutting lines 350c.

A description will now be given of the terminal members 492 mounted on the circuit boards 352 that are to be cut out from the large substrate 350.

Figure 12:
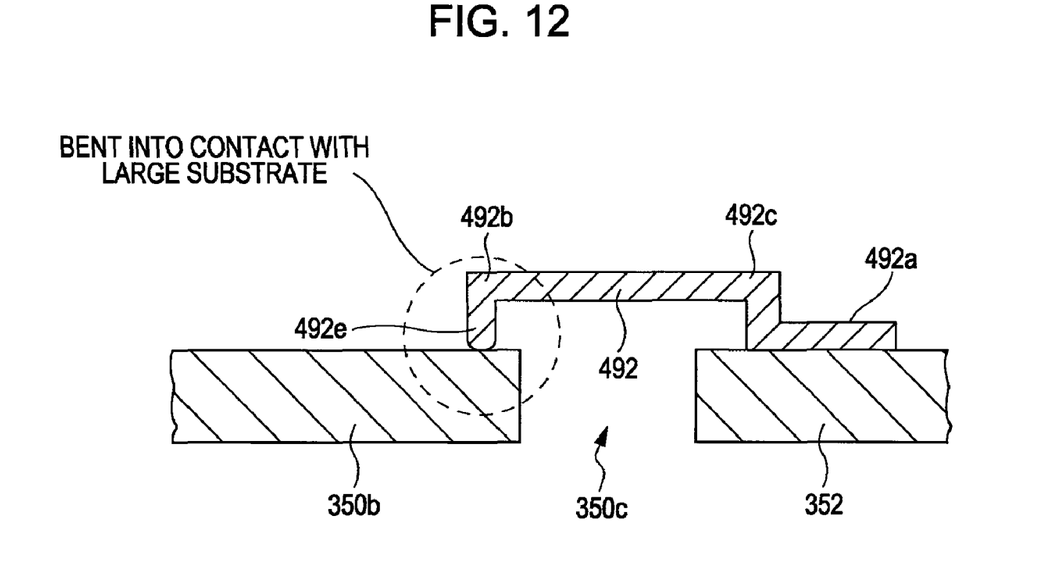
FIG. 12 is an explanatory view showing a terminal member in the third embodiment.

As shown in FIG. 12, a contact portion 492b of each terminal member 492 has a leg portion 492e. The leg portion 492e extends in a different direction from a surface of the unnecessary portion 350b, and the end of the leg portion 492e is in contact with the unnecessary portion 350b of the large substrate 350. Further, the terminal member 492 is long enough to cross the cutting line 350c. In other words, when the terminal member 492 is mounted on the circuit board 352 which is to be cut out from the large substrate 350, the terminal member 492 is supported by the circuit board 352 and the unnecessary portion 350b of the large substrate 350 through a mounting portion 492a and the leg portion 492e.

Therefore, the mounting portion 492a of the terminal member 492 can be stably in contact with the larger substrate 350. Consequently, the area occupied by the mounting portion 492a in the circuit board 352 can be reduced, and the area of the contact portion 492b can be increased. This ensures a stable contact between flat springs 341N and 341P and the terminal members 492.

The above figures may depict exemplary configurations for the invention, which is done to aid in understanding the features and functionality that can be included in the invention. The invention is not restricted to the illustrated architectures or configurations, but can be implemented using a variety of alternative architectures and configurations. Additionally, although the invention is described above in terms of various exemplary embodiments and implementations, it should be understood that the various features and functionality described in one or more of the individual embodiments with which they are described, but instead can be applied, alone or in some combination, to one or more of the other embodiments of the invention, whether or not such embodiments are described and whether or not such features are presented as being a part of a described embodiment. Thus the breadth and scope of the present invention, especially in the following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A portable electronic device comprising:
   a case;
   a circuit board in the case;
   an electronic component in the case, comprising a connection terminal and a portion facing a side surface of the circuit board;
   a terminal member for connecting the circuit board and the connection terminal of the electronic component, the terminal member including a mounting portion mounted on the circuit board and a contact portion contacting on the connection terminal,
   wherein the case comprises a contact region contacting the terminal member.

2. The portable electronic device according to claim 1, wherein the contact region of the case contacts the mounting portion of the terminal member.

3. The portable electronic device according to claim 1, wherein the contact region of the case contacts the contact portion of the terminal member.

4. The portable electronic device according to claim 1, wherein the case comprises a first sub-case and a second sub-case connected to the first sub-case and the second sub-case comprises the contact region.

5. The portable electronic device according to claim 4, wherein the second sub-case comprises a pressing portion which presses the circuit board.

6. A portable electronic device comprising:
   a case;
   a circuit board in the case;
   an electronic component in the case, comprising a connection terminal and a portion facing a side surface of the circuit board;
   a terminal member for connecting the circuit board and the connection terminal of the electronic component, the terminal member including a mounting portion mounted on the circuit board and a contact portion contacting on the connection terminal,
   wherein the case comprises a first sub-case and a second sub-case which has an inner surface facing the terminal member,
   wherein the contact portion of the terminal member is closer to the second sub-case than to the mounting portion of the terminal member.

7. The portable electronic device according to claim 6, wherein the contact portion of the terminal member has a leg portion along a direction perpendicular to the circuit board.

8. The portable electronic device according to claim 7, wherein the end of the leg portion is on the same level as a surface of the circuit board.

* * * * *